United States Patent
Min et al.

(10) Patent No.: US 12,336,331 B2
(45) Date of Patent: Jun. 17, 2025

(54) LIGHT EMITTING DIODE

(71) Applicant: SEOUL VIOSYS CO., LTD., Gyeonggi-do (KR)

(72) Inventors: Dae Hong Min, Gyeonggi-do (KR); Yong Hyun Baek, Gyeonggi-do (KR); Ji Hun Kang, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 452 days.

(21) Appl. No.: 17/853,068

(22) Filed: Jun. 29, 2022

(65) Prior Publication Data

US 2023/0011795 A1    Jan. 12, 2023

Related U.S. Application Data (60) Provisional application No. 63/352,838, filed on Jun. 16, 2022, provisional application No. 63/216,910, filed on Jun. 30, 2021.

(51) Int. Cl.
*H10H 20/821* (2025.01)
*H10H 20/812* (2025.01)
(Continued)

(52) U.S. Cl.
CPC ........ *H10H 20/821* (2025.01); *H10H 20/812* (2025.01); *H10H 20/815* (2025.01); *H10H 20/825* (2025.01)

(58) Field of Classification Search
CPC ......... H01L 33/24; H01L 33/06; H01L 33/12; H01L 33/32
See application file for complete search history.

(56) References Cited

U.S. PATENT DOCUMENTS

| | | |
|---|---|---|
| 2015/0083993 A1 | 3/2015 | Nagata et al. |
| 2016/0141455 A1* | 5/2016 | Lim ........................ H01L 33/22 438/46 |
| 2019/0348567 A1 | 11/2019 | Na et al. |

FOREIGN PATENT DOCUMENTS

| | | |
|---|---|---|
| CN | 105552188 A | 5/2016 |
| KR | 1020120084839 A | 7/2012 |

(Continued)

OTHER PUBLICATIONS

Chang, et al, 'Manipulation of nanoscale V-pits to optimize internal quantum efficiency of InGaN multiple quantum wells', Applied Physics Letters, 2015, vol. 106, pp. 1-5.

(Continued)

*Primary Examiner* — Jay C Kim
*Assistant Examiner* — Woo K Lee
(74) *Attorney, Agent, or Firm* — LaBatt, LLC (57) ABSTRACT

A multi-band light emitting diode is provided. The multi-band light emitting diode includes a first conductivity type semiconductor layer, a V-pit generation layer disposed on the first conductivity type semiconductor layer and having a first V-pit of a first inlet width, a stress relief layer disposed on the V-pit generation layer and providing a second V-pit of a second inlet width greater than the first inlet width of the V-pit on the first V-pit, an active layer disposed on the stress relief layer and including a first active layer region formed on a flat surface of the stress relief layer and a second active layer region formed in the second V-pit, and a second conductivity type semiconductor layer disposed on the active layer.

20 Claims, 5 Drawing Sheets

(51) Int. Cl.
 *H10H 20/815* (2025.01)
 *H10H 20/825* (2025.01)

(56) References Cited

FOREIGN PATENT DOCUMENTS

| KR | 1020180080592 A | 7/2018 |
| KR | 1020200009847 A | 1/2020 |
| KR | 20200084637 A | 7/2020 |

OTHER PUBLICATIONS

Wang, et al, 'White light-emitting diodes based on a single InGaN emission layer', Applied Physics Letters, 2007, vol. 91, pp. 1-3.
English translation of International Search Report for International Application No. PCT/KR2022/009412, Oct. 11, 2022, 3 pages.
Extended European Search Report for European Patent Application No. 22833662.4, May 15, 2025, 8 pages.

\* cited by examiner

LIGHT EMITTING DIODE

CROSS-REFERENCE OF RELATED APPLICATIONS AND PRIORITY

The present application is a non-provisional application which claims priority to U.S. Provisional Application Nos. 63/216,910 filed Jun. 30, 2021 and 63/352,838 filed Jun. 16, 2022, the disclosure of which are incorporated by reference as they are fully set forth herein.

TECHNICAL FIELD

The present disclosure relates to a light emitting diode, and more particularly, to a light emitting diode emitting light of a plurality of bands at a single chip level.

BACKGROUND

Nitride semiconductors are used as light sources for displaying apparatuses, traffic lights, lighting, or optical communication devices, and may be mainly used for light emitting diodes or laser diodes that emit blue or green light. In addition, nitride semiconductors may be used in a heterojunction bipolar transistor (HBT), a high electron mobility transistor (HEMT), and the like.

In general, a light emitting diode using the nitride semiconductor has a heterojunction structure having a quantum well structure between an N contact layer and a P contact layer. The light emitting diode emits light of a specific wavelength depending on a composition of a well layer in the quantum well structure. To increase internal quantum efficiency and reduce losses due to light absorption, the light emitting diode is designed to emit a spectrum of light having a single peak, i.e., monochromatic light.

Mixed color light emitted from lighting, for example, white light cannot be implemented as a single peak monochromatic light. Accordingly, techniques of implementing white light by using a plurality of light emitting diodes together emitting different monochromatic lights from one another or by using phosphors converting a wavelength of light emitted from the light emitting diode is generally used.

The use of phosphors comes with cost of the phosphors or a decrease in efficiency known as Stoke's shift. In addition, a process of applying phosphors on the light emitting diode and yellowing of a carrier carrying phosphors should be taken into consideration.

In addition, using a mixture of a plurality of light emitting diodes also complicates the process, and it is inconvenient to prepare the light emitting diodes made of different materials from one another.

When a light emitting diode emitting light of a plurality of bands at a single chip level is used, a plurality of light emitting diodes made of different materials can be avoided, and the use of a phosphor may be eliminated or at least reduced.

SUMMARY

Exemplary embodiments provide a novel light emitting diode configured to emit light of a plurality of bands at a single chip level.

Exemplary embodiments provide a novel technique capable of increasing an intensity of light of a shorter wavelength band in a light emitting diode of a plurality of bands.

Exemplary embodiments provide a multi-band light emitting diode in which an intensity of a shorter wavelength band is further increased compared to that of a longer wavelength band.

A light emitting diode according to an exemplary embodiment of the present disclosure includes a first conductivity type semiconductor layer, a V-pit generation layer disposed on the first conductivity type semiconductor layer and having a first V-pit of a first inlet width, a stress relief layer disposed on the V-pit generation layer and providing a second V-pit of a second inlet width greater than the first inlet width of the V-pit on the first V-pit, an active layer disposed on the stress relief layer and including a first active layer region formed on a flat surface of the stress relief layer and a second active layer region formed in the second V-pit, and a second conductivity type semiconductor layer disposed on the active layer.

The stress relief layer may include an $In_xAl_yGa_{1-x-y}N$ layer ($0<x<1$, $0 \leq y<1$), and an average lattice constant of the stress relief layer may be greater than an average lattice constant of the V-pit generation layer and smaller than an average lattice constant of the active layer.

The stress relief layer may include a plurality of pairs of different nitride semiconductor layers.

The stress relief layer may have a stacked structure in which nitride semiconductor layers having different band gap energies are alternately disposed.

The stress relief layer may include a superlattice layer.

The superlattice layer may be an InGaN/GaN superlattice layer.

In an exemplary embodiment, a number of pairs of the stress relief layer may be greater than a number of pairs of a barrier layer and a well layer of the active layer.

The number of pairs of the stress relief layer may be 6 to 20.

The light emitting diode may further include a gap layer disposed between the stress relief layer and the active layer, in which the gap layer may have a lattice constant smaller than the average lattice constant of the stress relief layer and the average lattice constant of the active layer.

The gap layer may include a GaN layer.

A light emitting diode according to an exemplary embodiment of the present disclosure includes a first conductivity type semiconductor layer, a V-pit generation layer having V-pits; a stress relief layer disposed on the V-pit generation layer, an active layer disposed on the stress relief layer, and a second conductivity type semiconductor layer disposed on the active layer. The light emitting diode emits light of a multi-band spectrum of a shorter wavelength band and a longer wavelength band, and under an operating current, an intensity of light of the shorter wavelength band is higher than an intensity of light of the longer wavelength band.

In the light emitting diode, the intensity of light in the shorter wavelength band may be two or more times higher than that of light in the longer wavelength band.

In the light emitting diode, the intensity of light in the shorter wavelength band may be three or more times higher than that of light in the longer wavelength band.

The stress relief layer may be a superlattice layer having a plurality of pairs.

The number of pairs of the stress relief layer may be within a range of 6 to 20.

The number of pairs of the stress relief layer may be greater than that of pairs of a well layer and a barrier layer of the active layer.

The superlattice layer may be an InGaN/GaN superlattice layer.

A peak wavelength of light in the shorter wavelength band may be within a range of 380 nm to 450 nm, and a peak wavelength of light in the longer wavelength band may be within a range of 540 nm to 580 nm.

The stress relief layer may include an $In_xAl_yGa_{1-x-y}N$ layer (0<x<1, 0≤y<1), and an average lattice constant of the stress relief layer may be greater than an average lattice constant of the V-pit generation layer and smaller than an average lattice constant of the active layer.

The second conductivity type semiconductor layer may have concave grooves formed on a surface thereof, and an inlet width of at least one of the concave grooves may exceed 400 nm.

DETAILED DESCRIPTION OF EMBODIMENTS

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the exemplary embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 1:
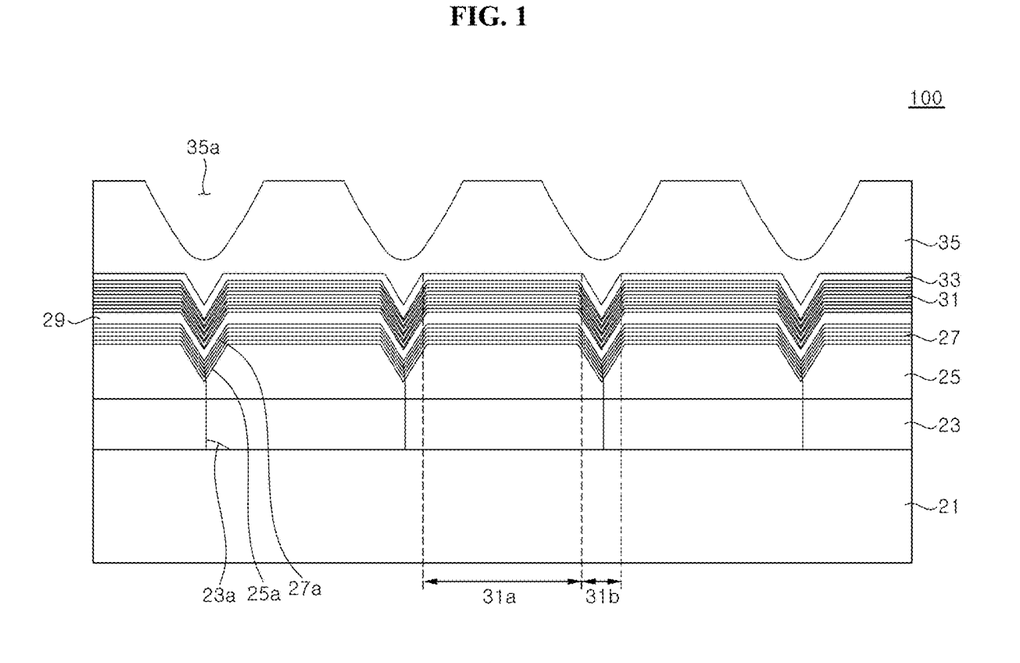
FIG. 1 is a schematic cross-sectional view illustrating a light emitting diode according to an exemplary embodiment of the present disclosure.
Figure 2:
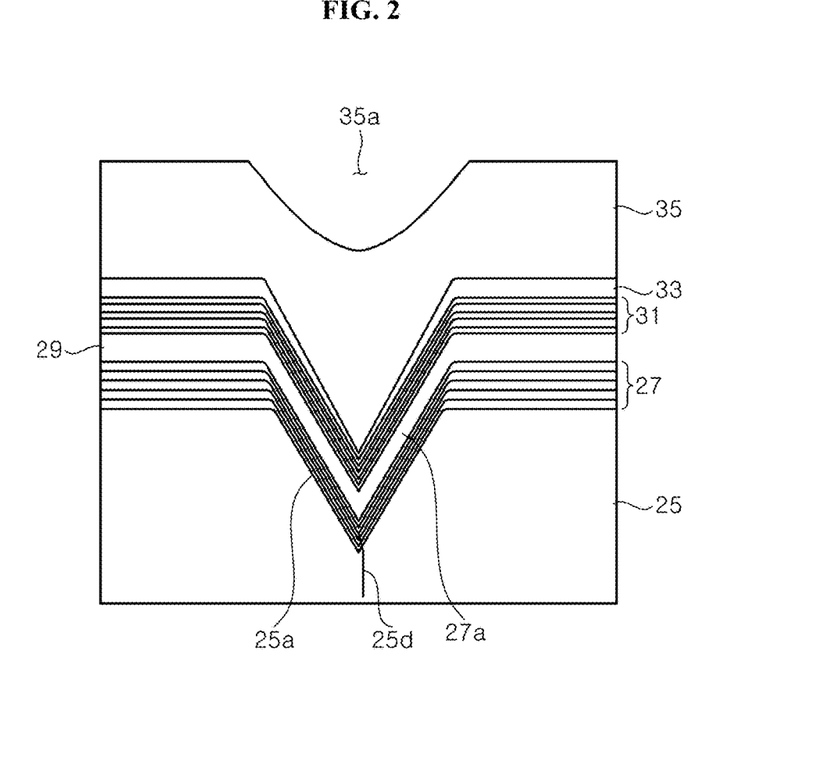
FIG. 2 is a partially enlarged view of FIG. 1.

FIG. 1 is a schematic cross-sectional view illustrating a light emitting diode 100 according to an exemplary embodiment of the present disclosure, and FIG. 2 is a partially enlarged view of FIG. 1.

Referring to FIG. 1 and FIG. 2, the light emitting diode 100 may include a substrate 21, a first conductivity type semiconductor layer 23, a V-pit generation layer 25, a stress relief layer 27, a gap layer 29, an active layer 31, an electron blocking layer 33, and a second conductivity type semiconductor layer 35.

The substrate 21 is for growing a gallium nitride-based semiconductor layer, and may include a sapphire substrate, a GaN substrate, a SiC substrate, a Si substrate, a spinel substrate, or the like. The substrate 21 may have protrusions, and may be, for example, a patterned sapphire substrate. However, the inventive concepts are not limited thereto, and may be a substrate having a flat upper surface, for example, a sapphire substrate.

The first conductivity type semiconductor layer 23 may be a nitride-based semiconductor layer doped with an n-type impurity, and may be formed of, for example, a GaN layer doped with Si. For example, a Si doping concentration doped into the first conductivity type semiconductor layer 23 may be $5\times10^{17}/cm^2$ to $5\times10^{19}/cm^2$. The first conductivity type semiconductor layer 23 may be grown under a growth pressure of 150 Torr to 200 Torr at 1000° C. to 1200° C. (e.g., 1050° C. to 1100° C.) by supplying a metal source gas into a chamber using MOCVD technology. In this case, a nucleation layer and a high-temperature buffer layer may be additionally formed so as to grow the first conductivity type semiconductor layer 23. That is, the nucleation layer, the high-temperature buffer layer, and the first conductivity type semiconductor layer 23 may be continuously formed on the substrate 21. A large number of threading dislocations may be formed in the high-temperature buffer layer, and at least portions of the threading dislocations in the high-temperature buffer layer may be transferred to the first conductivity type semiconductor layer 23. Threading dislocations 23a in the first conductivity type semiconductor layer 23 may extend from a lower surface to an upper surface of the first conductivity type semiconductor layer 23.

The V-pit generation layer 25 is disposed over the first conductivity type semiconductor layer 23. In an exemplary embodiment of the present disclosure, the V-pit generation layer 25 may be formed of, for example, a GaN layer. The V-pit generation layer 25 may be grown at a relatively lower temperature than that for growing the first conductivity type semiconductor layer 23, for example, about 900° C., and thus, V-pits 25a are formed in the V-pit generation layer 25.

Since the V-pit generation layer 25 is grown at the relatively lower temperature than that for growing the first conductivity type semiconductor layer 23, a crystal quality may be artificially reduced and a three-dimensional growth may be promoted to generate the V-pits 25a.

The V-pits 25a may have a hexagonal pyramid shape when a growth surface of the nitride semiconductor layer is a c-plane. The V-pits 25a may be formed at upper ends of the threading dislocations 23a.

The V-pit generation layer 25 may be formed to have a thickness smaller than that of the first conductivity type semiconductor layer 23, for example, to have a thickness of about 450 nm to about 600 nm. Sizes of the V-pits 25a formed in the V-pit generation layer 25 may be controlled through a growth condition and a growth time of the V-pit generation layer 25. In an exemplary embodiment, a maximum width of an inlet of the V-pits 25a formed in the V-pit generation layer 25 may generally exceed about 200 nm, and may be about 350 nm or less. The size of the V-pit 25a is related to a total volume of an active layer region 31b formed in the V-pit 25a. As the size the V-pit 25a increases, the total volume of the active layer region 31b increases, thereby increasing an amount of light in a shorter wavelength band. When the size of the V-pit 25a is excessively small, the total volume of the active layer region 31b becomes small, and thus, it is difficult to increase the amount of light in the shorter wavelength band.

The thickness of the V-pit generation layer 25 affects the size of the V-pit 25a. To form the V-pit 25a large, the thickness of the V-pit generation layer 25 increases. However, since the V-pit generation layer 25 has a smaller lattice constant than that of the active layer 31, an increase in the thickness of the V-pit generation layer 25 results in an increase in stress applied to the active layer 31. The thickness of the V-pit generation layer 25 may be limited in consideration of the stress applied to the active layer 31. That is, there is a trade-off relationship between an increase in the volume of the active layer region 31b through the increase in the size of the V-pit 25a and the stress applied to the active layer 31.

In the illustrated exemplary embodiment, although it is described that the V-pit generation layer 25 is a single layer, without being limited thereto, and it may be a multilayer. For example, the V-pit generation layer 25 may include at least two of GaN, AlGaN, InGaN, or AlGaInN layers.

The stress relief layer 27 may be disposed on the V-pit generation layer 25, and may be grown along the shape of the V-pit 25a formed in the V-pit generation layer 25. The stress relief layer 27 may include a plurality of nitride semiconductor layers, and for example, may include a superlattice layer (SLs) formed by repeatedly stacking materials having different energy band gaps multiple times. The stress relief layer 27 may be grown along the shape of the V-pit 25a formed in the V-pit generation layer 25, and may include a nitride semiconductor layer such as $In_xAl_yGa_{1-x-y}N$ (0<x<1, 0≤y<1).

The stress relief layer 27 is disposed between the V-pit generation layer 25 and the active layer 31 to relieve the stress applied to the active layer 31. An average lattice constant of the stress relief layer 27 may have a value between an average lattice constant of the V-pit generation layer 25 and an average lattice constant of the active layer 31. By way of example only, the average lattice constant of the stress relief layer 27 ranges between 3.2 Å and 3.25 Å. As another example, the average lattice constant of the V-pit generation layer 25 is under 3.2 Å and the average lattice constant of the active layer 31 is over 3.25 Å. For example, the stress relief layer 27 may be a superlattice layer including a plurality of InGaN/GaN pairs. Herein, a composition ratio of In in the InGaN of the stress relief layer 27 may be smaller than that of In in a well layer of the active layer 31.

By increasing a thickness of the stress relief layer 27, an inlet width of a V-pit 27a formed on an upper surface of the stress relief layer 27 may be increased. For example, by increasing the number of InGaN/GaN pairs in the superlattice layer of the stress relief layer 27, the inlet width of the V-pit 27a finally formed on the upper surface of the stress relief layer 27 may be increased. As discussed above, a number of pairs of nitride semiconductor layers included in the superlattice layer may be, for example, three (3) or more pairs, and further may be within the range of six (6) to twelve (12). Also, the number of pairs of the superlattice layer may be greater than the number of pairs of a barrier layer and a well layer in the active layer 31. Accordingly, while the stress applied to the active layer 31 is relieved, the volume of the active layer region 31b may be increased, and as a result, a luminous intensity of the shorter wavelength band may be relatively increased. In addition, by using the stress relief layer 27, a crystal quality of the active layer 31 may be improved, and thus, an internal quantum efficiency may be also improved in the active layer region 31a.

The stress relief layer 27 may include the same doped impurity as that of the first conductivity type semiconductor layer 23. The stress relief layer 27 may serve to relieve strain formed during a growth of the nitride semiconductor layer, thereby improving the crystal quality of the active layer 31 to increase a radiation efficiency of the light emitting diode.

The gap layer 29 is disposed between the active layer 31 and the stress relief layer 27. A lattice constant of the gap layer 29 may be smaller than the average lattice constant of the stress relief layer 27, and may be smaller than the average lattice constant of the active layer 31. The gap layer 29 may be a nitride-based semiconductor layer having the same composition as that of the barrier layer of the active layer 31 or any one layer in the stress relief layer 27, but the inventive concepts are not limited thereto. The gap layer 29 may be, for example, a GaN layer. A thickness of the gap layer 29 may be greater than a thickness of the barrier layer in the active layer 31, without being limited thereto. The gap layer 29 may be grown along a shape of the stress relief layer 27. The gap layer 29 may be omitted, and the active layer 31 may be directly grown on the stress relief layer 27.

The active layer 31 is formed on the stress relief layer 27. The active layer 31 may be in contact with the stress relief layer 27, but as described above, the gap layer 29 may be interposed between the stress relief layer 27 and the active layer 31. The active layer 31 may be formed along the shape of the V-pit 27a formed on a surface of the stress relief layer 27. The active layer 31 includes the active layer region 31a formed over a flat surface of the V-pit generation layer 25 and the active layer region 31b formed in the V-pit 27a, as shown in FIG. 1. A thickness of the active layer region 31b formed in the V-pit 27a is smaller than that of the active layer region 31a formed over the flat surface of the V-pit generation layer 25. The thickness of the active layer region 31b in the V-pit 27a may vary according to a depth of the V-pit 27a. The thickness of the active layer region 31b at an intermediate depth of the V-pit 27a may be about 1/3 or less of the thickness of the active layer region 31a formed over the flat surface of the V-pit generation layer 25. In particular, a thickness of a well layer at the intermediate depth of the V-pit 27a may be about 1/3 or less of a thickness of a well layer formed over the flat surface of the V-pit generation layer 25.

The well layer in the active layer 31 may be formed of $In_xAl_yGa_{1-x-y}N$ (0<x<1, 0≤y<1). Composition ratios of In, Al, and Ga may be selected depending on a required light. The active layer region 31a formed over the flat surface of the V-pit generation layer 25 has a composition for emitting light of a longer wavelength band among multi-bands. Meanwhile, the active layer region 31b formed in the V-pit 27a has a composition for emitting light of a shorter wavelength band among multi-bands. For example, the composition ratio of In in the active layer region 31a is higher than that of In in the active layer region 31b. The active layer region 31a may include InGaN having a composition emitting yellow light, and the active layer region 31b may include InGaN having a composition emitting green or blue light.

The active layer region 31b may be formed with the same composition on each surface in the V-pit 27a, without being limited thereto, and may be formed on each surface with a different composition from one another. The light emitting diode 100 of the present disclosure may implement light having at least two bands at a single chip level using the active layer region 31a and the active layer region 31b.

The barrier layer may be formed of a nitride semiconductor layer such as GaN, InGaN, AlGaN, or AlInGaN having a wider bandgap than that of the well layer. For example, when the active layer region 31a includes an InGaN well layer emitting yellow light, the barrier layer may be formed of InGaN or InAlGaN having a lower content of In than that of the well layer. The thickness of the well layer may be within a range of 2.5 nm to 3.5 nm, and the thickness of the barrier layer may be within a range of 10 nm to 12 nm.

The active layer 31 may further include a capping layer between the well layer and the barrier layer. The capping layer may be formed prior to barrier layer deposition so as to prevent dissociation of In in the well layer during a barrier layer deposition.

The light emitting diode 100 of the present disclosure may emit white light by mixing light of the longer wavelength band emitted from the active layer region 31a and light of the shorter wavelength band emitted from the active layer region 31b.

The second conductivity type semiconductor layer 35 is disposed on the active layer 31. The electron blocking layer 33 may be disposed between the second conductivity type semiconductor layer 35 and the active layer 31. The electron blocking layer 33 may include a p-type $Al_xGa_{1-x}N$ layer (0<x<1).

The second conductivity type semiconductor layer 35 may be formed of a semiconductor layer doped with a p-type impurity, for example, GaN. The second conductivity type semiconductor layer 35 may be a single layer or a multilayer, and may include a p-type contact layer. As shown in FIG. 1, the second conductivity type semiconductor layer 35 may have a concave groove 35a over the V-pit 25a. Since the concave groove 35a is formed in the second conductivity type semiconductor layer 35 in the illustrated exemplary embodiment, when light generated in the active layer region 31b is emitted to the outside through the second conductivity type semiconductor layer 35, it is possible to reduce light absorption by the second conductivity type semiconductor layer 35, and thus, light extraction efficiency may be improved.

According to the exemplary embodiments of the present disclosure, the light emitting diode emitting light of a plurality of bands using the V-pits 25a and 27a is disclosed. The active layer region 31b formed in the V-pit 27a emits light of the shorter wavelength band, the active layer region 31a formed on the flat surface around the V-pit 27a emits light of the longer wavelength band, and it is possible to implement white light due to a combination of these light.

A light emitting diode using conventional V-pits has a relatively weak intensity of light in the shorter wavelength band, and thus, it was difficult to implement white light having a high color temperature. In particular, a well layer having a high content of In is used so as to emit light in a longer wavelength band, and large stress may be generated in an active layer having the high content of In due to a large lattice mismatch between epitaxial layers. The stress applied to the active layer causes internal defects in the active layer, and indium phase separation occurs. The internal defects and the indium phase separation lower a radiative recombination efficiency in the active layer, and thus, a radiation efficiency is lowered.

Meanwhile, the light emitting diode 100 of the present disclosure reduces the stress applied to the active layer 31 by using the stress relief layer 27 and further, increases the volume of the active layer region 31b formed in the V-pit 27a using the stress relief layer 27. Accordingly, the radiation efficiency of the light emitting diode 100 may be increased, and the intensity of light in the shorter wavelength band emitted from the active layer region 31b may also be greatly increased.

Figure 3A:
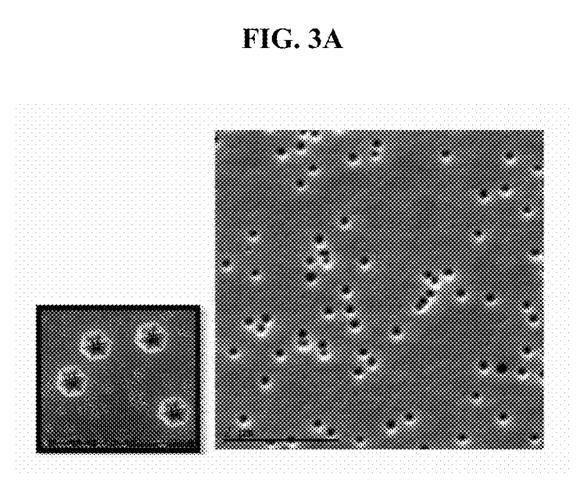
FIG. 3A is a Cathodoluminescence (CL) image showing a surface of a light emitting diode according to a prior art.
Figure 3B:
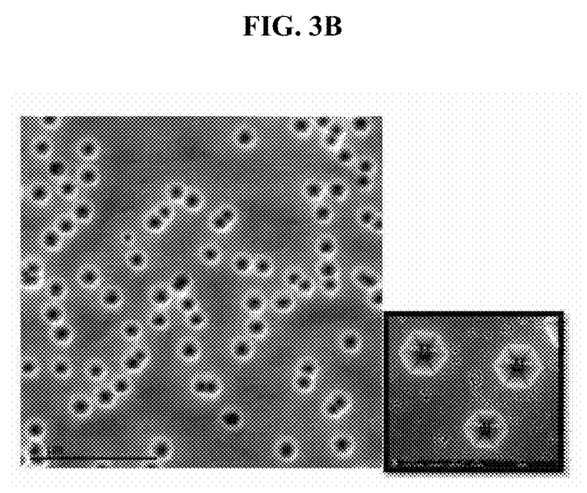
FIG. 3B is a CL image showing a surface of a light emitting diode according to an exemplary embodiment of the present disclosure.

FIG. 3A is a Cathodoluminescence (CL) image showing a surface of a light emitting diode according to the prior art, and FIG. 3B is a CL image showing a surface of a light emitting diode according to an exemplary embodiment of the present disclosure. FIG. 3A and FIG. 3B show sizes of the images at the same magnification, which are enlarged images, respectively.

FIG. 3A shows a surface of a second conductivity type semiconductor layer of a light emitting diode fabricated without a stress relief layer such as the stress relief layer 27, and FIG. 3B shows a surface of the second conductivity type semiconductor layer 35 of the light emitting diode to which the stress relief layer 27 formed on the V-pit generation layer 25 is added according to the present disclosure. Concave grooves 35a formed over V-pits 25a of the V-pit generation layer 25 are shown in each image. Except for the presence or absence of the stress relief layer 27, the light emitting diodes of FIG. 3A and FIG. 3B have the same structure.

As shown in FIG. 3A, an inlet width of the concave grooves formed on the surface of the second conductivity type semiconductor layer has a size of approximately 314 nm to 330 nm. On the contrary, as shown in FIG. 3B, by adding the stress relief layer 27, an inlet width of the concave grooves formed on the surface of the second conductivity type semiconductor layer has a size of approximately 390 nm to 440 nm. The sizes of the concave grooves 35a formed on the surface of the second conductivity type semiconductor layer 35 were increased by approximately 70 nm to 110 nm by the addition of the stress relief layer 27. A size of the V-pit 27a formed on the surface of the stress relief layer 27 will be further increased by increasing a thickness of the stress relief layer 27.

Figure 4:
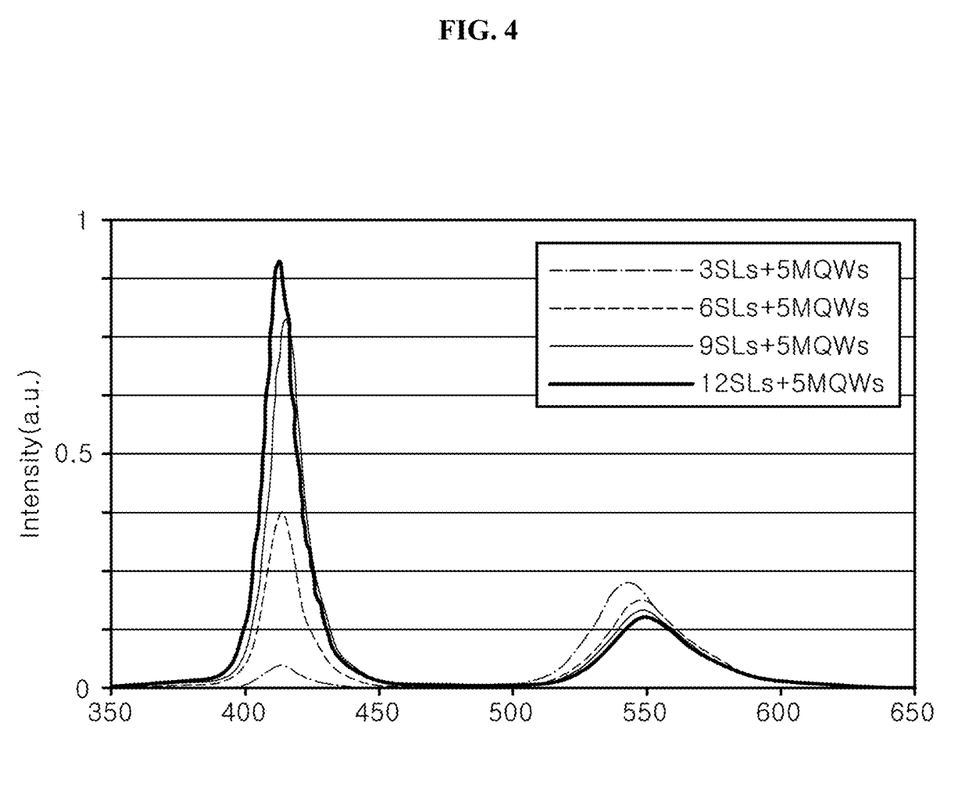
FIG. 4 is a graph showing an Electroluminescence (EL) spectrum according to an increase in a number of pairs of a stress relief layer.

FIG. 4 is a graph showing an Electroluminescence (EL) spectrum according to an increase in a number of pairs of the stress relief layer. Other conditions were set to be identical, except that the number of InGaN/GaN pairs of the stress relief layer 27 was changed to 3, 6, 9, and 12 to fabricate the light emitting diode, and the number of pairs of a barrier layer and a well layer of an active layer 31 was set to five (5). A thickness of the InGaN/GaN of the stress relief layer 27 was about 3 μm/5.8 Å composition ratio of In of InGaN was within a range of about 0.07 to 0.1, which was 1/2 or less than a composition ratio of In of about 0.2 of the well layer. An emission spectrum was measured under a current density of 35 A/cm$^2$.

Referring to FIG. 4, as the number of pairs of the stress relief layer 27 was increased, an intensity of light emitted in a shorter wavelength band (about 380 to about 450 nm) was increased. In particular, when the number of pairs of the stress relief layer 27 is six (6), which is more than five (5) pairs of the active layer 31, an intensity of light at a peak wavelength of the shorter wavelength band exceeded twice of an intensity of light at a peak wavelength of a longer wavelength band (about 540 to about 580 nm). As the number of pairs of the stress relief layer 27 was increased to nine (9), the intensity of light at the peak wavelength of the shorter wavelength band exceeded 4 times the intensity of light at the peak wavelength of the longer wavelength band, and when the number of pairs was increased to twelve (12), the intensity of light at the peak wavelength of the shorter wavelength band exceeded 5 times the intensity of light at the peak wavelength of the longer wavelength band. When the number of pairs was increased from six (6) to nine (9) compared to when the number of pairs was increased from three (3) to six (6), the intensity of light in the shorter wavelength band exhibited larger. On the contrary, when the number of pairs was increased from nine (9) to twelve (12), the increase in the intensity of light in the shorter wavelength band was relatively small. As such, the increase in the intensity of light in the shorter wavelength band is expected to be saturated as the number of pairs is increased, and thus, an appropriate number of pairs will be less than 20.

A size of the V-pit 27a formed on the surface of the stress relief layer 27 will be increased as the number of pairs of the stress relief layer 27 is increased, and thus, a total volume of the active layer region 31b formed in the V-pit 27a will be increased. As such, as the thickness of the stress relief layer 27 is increased, the total volume of the active layer region 31b is increased and thus, it can be seen that the intensity of light in the shorter wavelength band is increased compared to that of light in the longer wavelength band. In addition, since a total volume of an active layer region 31a emitting light in the longer wavelength band is relatively reduced, it can be expected that the intensity of light in the longer wavelength band is decreased. However, an internal quantum efficiency is increased due to an improvement of a crystal quality of the active layer region 31a, and accordingly, it seems that the intensity of light in the longer wavelength band is relatively decreased.

Meanwhile, it can be seen that in the relatively larger V-pit 27a, more various thicknesses of the active layer region 31b and more various InGaN compositions may be disposed and thus, it can be seen that a wavelength range of light emitted in the shorter wavelength band becomes wider. On the contrary, in the longer wavelength band, a wavelength range of emitted light may be narrower as the crystal quality of the active layer region 31a is improved.

Furthermore, as shown in FIG. 4, as the number of pairs of the stress relief layer 27 is increased, the peak wavelength of the longer wavelength band is shifted to the right. Since the well layer of the active layer 31 has a high content of In, an indium phase separation may easily occur in the well layer due to the applied stress. As the thickness of the stress relief layer 27 is increased, the stress applied to the well layer is reduced to prevent the indium phase separation, so it is considered that the peak wavelength of the longer wavelength band is shifted to the longer wavelength. That is, it can be seen that the content of In in the InGaN well layer is increased by increasing the thickness of the stress relief layer 27.

When an intensity ratio of the exemplary embodiment implemented in FIG. 4 is expressed in the following table. An intensity ratio (shorter wavelength:longer wavelength) according to a ratio of the number of pairs of the stress relief layer based on the number of pairs of an active layer is as follows. When the number of pairs of the stress relief layer is equal to or greater than 1.2 times that of the active layer, the V-pit expands, and thus, it is possible to implement white light. In addition, since the intensity ratio of the shorter wavelength, which is light generated from the V-pit, is two times or more than that of the longer wavelength, it is possible to effectively implement white light.

|  | Pair Ratio (SLs:MQW) | Intensity Ratio (shorter wavelength:longer wavelength) | |
|---|---|---|---|
| Comparative Example 1 | 0.6:1 | 0.25:0.90 | (0.3:1) |
| Experimental Example 1 | 1.2:1 | 1.50:0.75 | (2.0:1) |
| Experimental Example 2 | 1.8:1 | 3.20:0.70 | (4.5:1) |
| Experimental Example 3 | 2.4:1 | 3.70:0.60 | (6.2:1) |

An intensity ratio depending on a thickness ratio of the stress relief layer based on the thickness of the active layer is as follows. When the thickness of the stress relief layer is equal to or greater than 0.6 times that of the active layer, the V-pit expands, and it is possible to implement white light. In addition, since the intensity of the shorter wavelength of light, which is generated from the V-pit, is two times or more than that of the longer wavelength, it is possible to effectively implement white light.

|  | Thickness ratio (SLs:MQW) | Intensity ratio (shorter wavelength:longer wavelength) | |
|---|---|---|---|
| Comparative Example 1 | 0.3~0.4:1 | 0.25:0.90 | (0.3:1) |
| Experimental Example 1 | 0.6~0.9:1 | 1.50:0.75 | (2.0:1) |
| Experimental Example 2 | 1.0~1.3:1 | 3.20:0.70 | (4.5:1) |
| Experimental Example 3 | 1.35~1.7:1 | 3.70:0.60 | (6.2:1) |

Figure 5A:
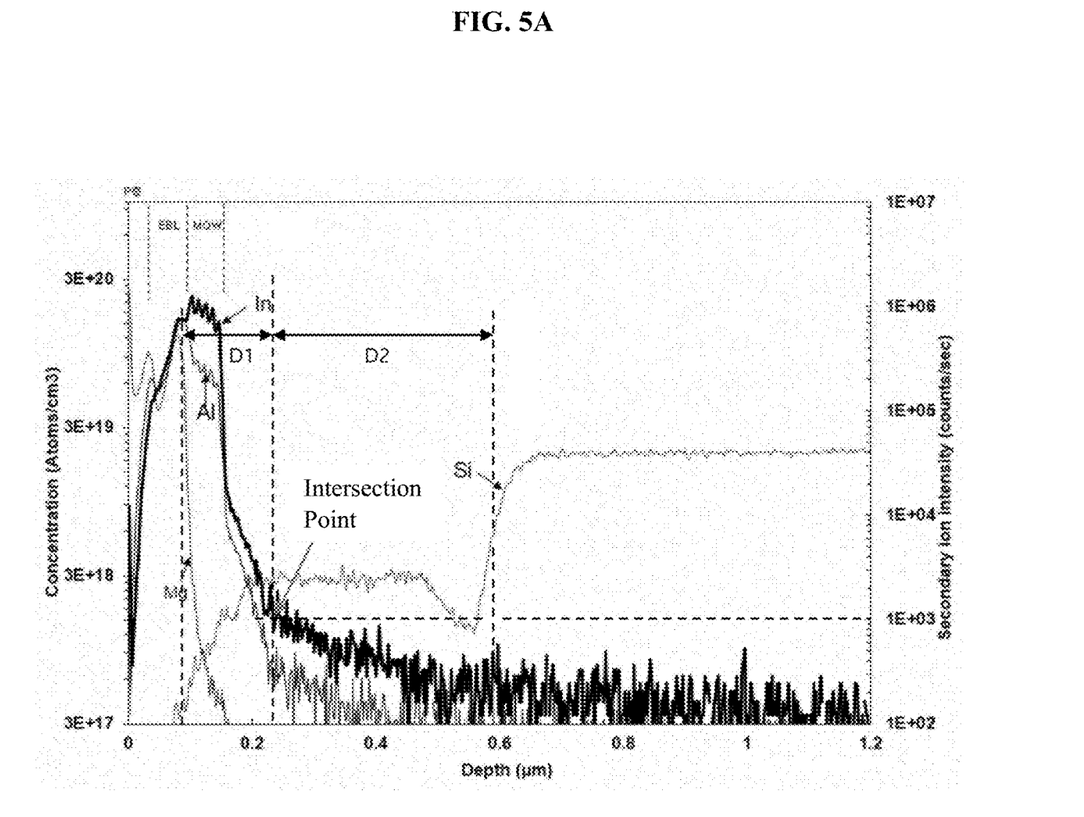
FIG. 5A is a secondary ion mass spectrometry (SIMS) analysis graph of a light emitting diode according to the prior art.
Figure 5B:
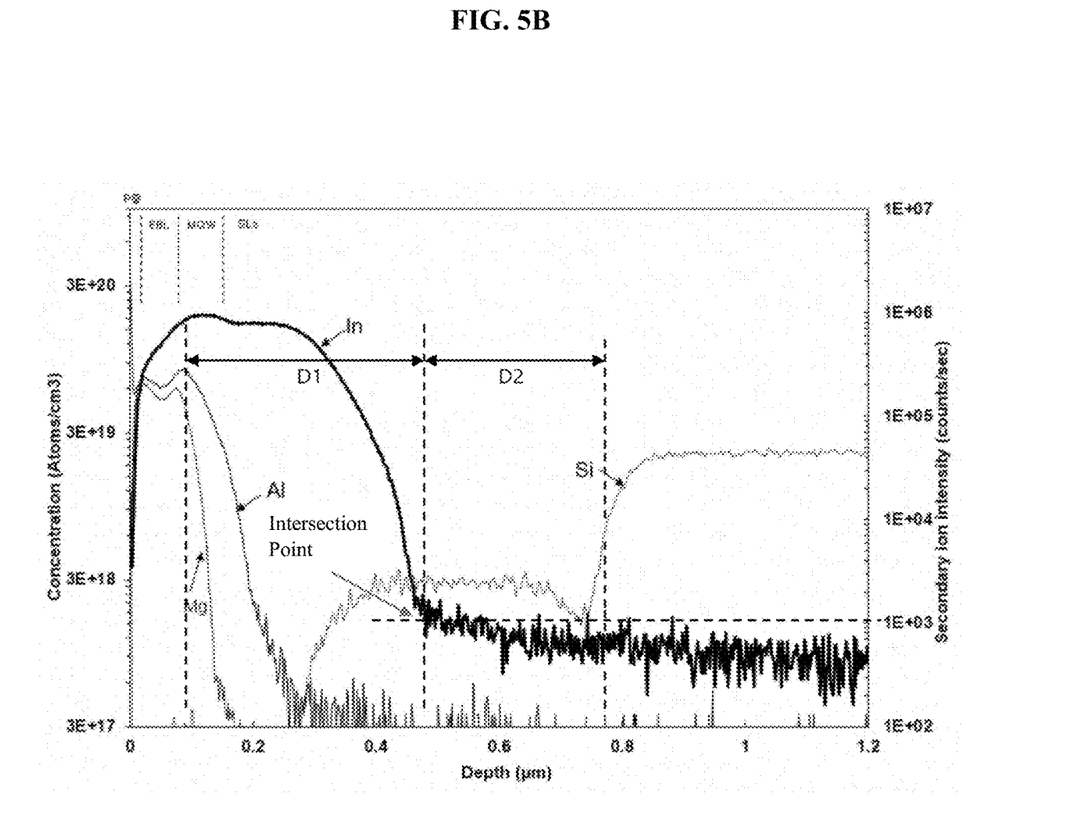
FIG. 5B is a SIMS analysis graph of a light emitting diode according to an exemplary embodiment of the present disclosure.

FIG. 5A is a secondary ion mass spectrometry (SIMS) analysis graph of a light emitting diode (Comparative Example) according to the prior art, and FIG. 5B is a SIMS analysis graph of a light emitting diode (Inventive Example) according to an exemplary embodiment of the present disclosure.

Referring to FIG. 5A and FIG. 5B, as the Comparative Example does not include the stress relief layer 27, a size of the V-pit is not large, and thus, a shape of an active layer (MQW) is observed as shown in FIG. 5A. On the contrary, in the light emitting diode of the Inventive Example in which the stress relief layer 27 (SLs) were added, the same active layer (MQW) as that of the Comparative Example was formed, but a slope of an In composition was so gentle that it was impossible to distinguish a well layer from a barrier layer of the active layer as shown in FIG. 5B. This is due to an increase in a region occupied by the V-pits within a beam size for SIMS analysis as the sizes of the V-pits are increased. That is, since a flat region and the V-pit region have a similar size, or the V-pit region exists in a larger size, during an etching by a SIMS analysis equipment, secondary ions emitted from the flat region and secondary ions emitted in the V-pit are mixed, which makes it impossible to distinguish a boundary between each layer.

Meanwhile, as arbitrarily indicated in FIG. 5B, the region of the active layer (MQW) includes a greater content of In than the region of the stress relief layer (SLs). An intensity of the secondary ions of In may have a profile that is an upward convex curve and decreases in a direction closer to a first conductivity type semiconductor layer with respect to the active layer. That is, in the region of D1 toward the intersecting point, a slope of the convex curve where an amount of In is decreased is gradually getting steeper.

Referring to FIG. 5A and FIG. 5B, the intensity of the secondary ions of In may be superimposed on a location where a concentration profile of Si is formed, and the intensity of the secondary ions of In may be gradually decreased toward the first conductivity type semiconductor layer to cross a base level, and reaches a base level of In, 1E+03 count/sec. That is, it is possible to predict the size of the V-pit according to how much depth the intensity of the secondary ions of In is formed at 1E+03 count/sec or more. Based on an intersection point where the intensity of the secondary ions of In and the base level cross, assuming that a distance from the intersection point to a peak point where an intensity of secondary ions of Al is the highest is called D1, and a distance from the intersection point of In to the first conductivity type semiconductor layer, that is, a distance from the concentration profile of Si to an approximately middle of a portion where the concentration of Si increases rapidly is called D2, it is possible to make the location of the intersection point of In with the base level closer to the first conductivity type semiconductor layer by expanding the volume of the V-pit through the exemplary embodiment of the present disclosure. D2 may be configured to be smaller than D1, and since the volume of the V-pit is expanded to get closer to the first conductivity type semiconductor layer, electron injection may be facilitated through the expanded V-pit, and white light may be implemented in a semiconductor device.

An In concentration profile in the D1 region may have a form in which an absolute value of the slope increases. That is, it may be a form in which the In concentration is rapidly reduced or a form in which the band gap energy is rapidly reduced. In addition, it may have a convex profile in a direction of the first conductivity type semiconductor layer.

Light generated from the light emitting diode may be emitted through the first conductivity type semiconductor layer or the second conductivity type semiconductor layer, and light emitted in this case may be white light.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. In addition, elements described in an embodiment may be applied to other embodiments without departing from the spirit of the present disclosure. Accordingly, it is therefore intended that the appended claims cover all such changes and modifications that are within the scope of the embodiments shown and described herein.

It should be understood that these embodiments are merely exemplary and are not intended to limit the scope of this disclosure.

The invention claimed is:

1. A light emitting diode, comprising:
a semiconductor layer stack comprising:
   a first conductivity type semiconductor layer including a first side and a second side;
   a V-pit generation layer disposed on the first side of the first conductivity type semiconductor layer and having a first V-pit of a first inlet width;
   a stress relief layer disposed on the V-pit generation layer and providing a second V-pit of a second inlet width greater than the first inlet width of the first V-pit;
   an active layer disposed on the stress relief layer and including a first active layer region formed on a flat surface of the stress relief layer and a second active layer region formed in the second V-pit; and
   a second conductivity type semiconductor layer disposed on the active layer,
wherein light emitted through the first conductivity type semiconductor layer or the second conductivity type semiconductor layer includes light having at least two distinct peak wavelengths, and
wherein a distance between a peak point at which an intensity of secondary ions of aluminum is highest in the semiconductor stack and an intersection point at which an intensity of secondary ions of indium in the semiconductor layer stack first drops below a base level of 1E+03 count/sec in a direction from the active layer toward the first conductivity type semiconductor layer is greater than a distance between the intersection point and a midpoint of a rising intensity of secondary ions of silicon corresponding to the first side of the first conductivity type semiconductor layer.

2. The light emitting diode of claim 1,
wherein the stress relief layer includes an $In_xAl_yGa_{1-x-y}N$ layer ($0<x<1$, $0\leq y<1$), and an average lattice constant of the stress relief layer is greater than an average lattice constant of the V-pit generation layer and smaller than an average lattice constant of the active layer.

3. The light emitting diode of claim 2,
wherein the stress relief layer includes a plurality of pairs of different nitride semiconductor layers.

4. The light emitting diode of claim 3,
wherein the stress relief layer has a stacked structure in which a first nitride semiconductor layer and a second nitride semiconductor layer are alternately disposed, the first and the second nitride semiconductor layers having different band gap energies.

5. The light emitting diode of claim 3,
wherein the stress relief layer includes a superlattice layer.

6. The light emitting diode of claim 5,
wherein the superlattice layer is an InGaN/GaN superlattice layer.

7. The light emitting diode of claim 3,
wherein a number of pairs of the plurality of different nitride semiconductor layers included in the stress relief layer is greater than a number of pairs of a barrier layer and a well layer included in the active layer.

8. The light emitting diode of claim 7,
wherein the number of pairs of the plurality of different nitride semiconductor layers included in the stress relief layer ranges between 6 and 20.

9. The light emitting diode of claim 1, further comprising:
a gap layer disposed between the stress relief layer and the active layer, wherein the gap layer has a lattice constant smaller than an average lattice constant of the stress relief layer and an average lattice constant of the active layer.

10. The light emitting diode of claim 9,
wherein the gap layer includes a GaN layer.

11. A light emitting diode, comprising:
a semiconductor layer stack comprising:
   a first conductivity type semiconductor layer;
   a V-pit generation layer having V-pits disposed on the first conductivity type semiconductor layer;
   a stress relief layer disposed on the V-pit generation layer;
   an active layer disposed on the stress relief layer; and
   a second conductivity type semiconductor layer disposed on the active layer,
wherein a distance between a peak point at which an intensity of secondary ions of aluminum is highest in the semiconductor stack and an intersection point at which an intensity of secondary ions of indium in the semiconductor layer stack first drops below a base level of 1E+03 count/sec in a direction from the active layer toward the first conductivity type semiconductor layer is greater than a distance between the intersection point and a midpoint of a rising intensity of secondary ions of silicon corresponding to a top surface of the first conductivity type semiconductor layer, and
wherein:
   the light emitting diode emits light of a multi-band spectrum of a shorter wavelength band and a longer wavelength band, and
   under an operating current at a current density of 35 Amps/cm$^2$, an intensity of light of the shorter wavelength band is higher than an intensity of light of the longer wavelength band.

12. The light emitting diode of claim 11, wherein the intensity of light in the shorter wavelength band is two or more times higher than the intensity of light in the longer wavelength band.

13. The light emitting diode of claim 11, wherein the intensity of light in the shorter wavelength band is three or more times higher than the intensity of light in the longer wavelength band.

14. The light emitting diode of claim 11, wherein the stress relief layer is a superlattice layer having a plurality of pairs of nitride semiconductor layers.

15. The light emitting diode of claim 14, wherein a number of the plurality of pairs of the nitride semiconductor layers included in the stress relief layer ranges from 6 to 20.

16. The light emitting diode of claim 14, wherein a number of the plurality of pairs of the nitride semiconductor layers included in the stress relief layer is greater than a number of pairs of a well layer and a barrier layer included in the active layer.

17. The light emitting diode of claim 14, wherein the superlattice layer includes an InGaN/GaN superlattice layer.

18. The light emitting diode of claim 11, wherein:
a peak wavelength of the shorter wavelength band is within a range of 380 nm to 450 nm, and
a peak wavelength of the longer wavelength band is within a range of 540 nm to 580 nm.

19. The light emitting diode of claim 18, wherein the stress relief layer includes an $In_xAl_yGa_{1-x-y}N$ layer ($0<x<1$, $0\leq y<1$), and an average lattice constant of the stress relief layer is greater than an average lattice constant of the V-pit generation layer and smaller than an average lattice constant of the active layer.

20. The light emitting diode of claim 11, wherein:
the second conductivity type semiconductor layer has a plurality of concave grooves formed on a surface thereof, and
at least one of the concave grooves has an inlet width greater than 400 nm.

* * * * *